US012672294B2

(12) United States Patent
Kuo et al.

(10) Patent No.: US 12,672,294 B2
(45) Date of Patent: Jun. 30, 2026

(54) RESISTIVE MEMORY DEVICE AND MANUFACTURING METHOD THEREOF

(71) Applicant: UNITED MICROELECTRONICS CORP., Hsin-Chu City (TW)

(72) Inventors: Chih-Wei Kuo, Tainan City (TW); Chung-Yi Chiu, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 393 days.

(21) Appl. No.: 18/223,043

(22) Filed: Jul. 18, 2023

(65) Prior Publication Data

US 2024/0422989 A1 Dec. 19, 2024

(30) Foreign Application Priority Data

Jun. 15, 2023 (TW) .................................. 112122311

(51) Int. Cl.
| | |
|---|---|
| *H10B 63/00* | (2023.01) |
| *H10N 70/00* | (2023.01) |
| *H10N 70/20* | (2023.01) |

(52) U.S. Cl.
CPC ............. *H10B 63/20* (2023.02); *H10B 63/80* (2023.02); *H10N 70/066* (2023.02); *H10N 70/24* (2023.02); *H10N 70/826* (2023.02); *H10N 70/841* (2023.02)

(58) Field of Classification Search
CPC ..... H10N 70/24; H10N 70/20; H10N 70/8833
See application file for complete search history.

(56) References Cited

U.S. PATENT DOCUMENTS

| | | | | |
|---|---|---|---|---|
| 8,173,989 | B2 | 5/2012 | Lee | |
| 10,680,172 | B2 * | 6/2020 | Mo ...................... | H10N 70/821 |
| 2012/0063201 | A1 * | 3/2012 | Hayakawa ........... | H10N 70/063 257/E21.645 |
| 2013/0119337 | A1 * | 5/2013 | Kang .................... | H10B 63/80 257/2 |
| 2013/0140515 | A1 * | 6/2013 | Kawashima ......... | H10N 70/021 257/4 |
| 2023/0270024 | A1 * | 8/2023 | Yang ................... | H10N 70/801 257/2 |

* cited by examiner

*Primary Examiner* — Mounir S Amer
(74) *Attorney, Agent, or Firm* — Winston Hsu

(57) ABSTRACT

A resistive memory device includes a dielectric layer, a trench, a first resistive switching element, a diode via structure, and a signal line structure. The trench is disposed in the dielectric layer. The first resistive switching element is disposed in the trench. The first resistive switching element includes a first bottom electrode, a first top electrode disposed above the first bottom electrode, and a first variable resistance layer disposed between the first bottom electrode and the first top electrode. The diode via structure is disposed in the dielectric layer and located under the trench, and the diode via structure is connected with the first bottom electrode. The signal line structure is disposed in the trench, a part of the signal line structure is disposed on the first resistive switching element, and the signal line structure is electrically connected with the first top electrode.

9 Claims, 18 Drawing Sheets

RESISTIVE MEMORY DEVICE AND MANUFACTURING METHOD THEREOF

BACKGROUND OF THE INVENTION

1. Field of the Invention

The present invention relates to a resistive memory device and a manufacturing method thereof, and more particularly, to a resistive memory device including a resistive switching element and a signal line structure disposed in a trench and a manufacturing method thereof.

2. Description of the Prior Art

Semiconductor memory devices are used in computer and electronics industries as a means for retaining digital information or data. Typically, the semiconductor memory devices are divided into volatile and non-volatile memory devices. The volatile memory device is a computer memory that loses its stored data when power to the operation is interrupted. Comparatively, in the non-volatile memory device, the stored data will not be lost when the power supply is interrupted. The resistive random access memory (RRAM) is a kind of non-volatile memory technology having the characteristics of low operating voltage, low power consumption, and high writing speed and is regarded as a memory structure that can be applied to many electronic devices.

SUMMARY OF THE INVENTION

A resistive memory device and a manufacturing method thereof are provided in the present invention. A resistive switching element with a three-dimensional configuration may be formed by forming the resistive switching element and a corresponding signal line structure in a trench. In addition, a manufacturing method of the resistive switching element and the signal line structure may be integrated with a manufacturing process of other conductive lines for manufacturing process simplification.

According to an embodiment of the present invention, a resistive memory device is provided. The resistive memory device includes a dielectric layer, a trench, a first resistive switching element, a diode via structure, and a signal line structure. The trench is disposed in the dielectric layer, and the trench is elongated in a first horizontal direction. The first resistive switching element is disposed in the trench, and the first resistive switching element includes a first bottom electrode, a first top electrode, and a first variable resistance layer. The first top electrode is disposed above the first bottom electrode, and the first variable resistance layer is disposed between the first bottom electrode and the first top electrode. The diode via structure is disposed in the dielectric layer and located under the trench, and the diode via structure is connected with the first bottom electrode. The signal line structure is disposed in the trench. A part of the signal line structure is disposed on the first resistive switching element, and the signal line structure is electrically connected with the first top electrode.

According to an embodiment of the present invention, a manufacturing method of a resistive memory device is provided. The manufacturing method includes the following steps. A diode via structure is formed in a dielectric layer. A first trench is formed in the dielectric layer, and the diode via structure is located under the first trench. A first resistive switching element is formed in the first trench. The first resistive switching element includes a first bottom electrode, a first top electrode, and a first variable resistance layer. The diode via structure is connected with the first bottom electrode, the first top electrode is disposed above the first bottom electrode, and the first variable resistance layer is disposed between the first bottom electrode and the first top electrode. A signal line structure is formed in the first trench, a part of the signal line structure is formed on the first resistive switching element, and the signal line structure is electrically connected with the first top electrode.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-18 are schematic drawings illustrating a manufacturing method of a resistive memory device according to an embodiment of the present invention, wherein FIG. 2 is a top view schematic drawing, FIG. 3 is a cross-sectional schematic diagram taken along a line A1-A1' in FIG. 2, FIG. 4 is a cross-sectional schematic diagram taken along a line B1-B1' in FIG. 2, FIG. 5 is a schematic drawing in a step subsequent to FIG. 3, FIG. 6 is a schematic drawing in a step subsequent to FIG. 4, FIG. 7 is a schematic drawing in a step subsequent to FIG. 5, FIG. 8 is a schematic drawing in a step subsequent to FIG. 6, FIG. 9 is a schematic drawing in a step subsequent to FIG. 7, FIG. 10 is a schematic drawing in a step subsequent to FIG. 8, FIG. 11 is a schematic drawing in a step subsequent to FIG. 9, FIG. 12 is a schematic drawing in a step subsequent to FIG. 10, FIG. 13 is a schematic drawing in a step subsequent to FIG. 11, FIG. 14 is a schematic drawing in a step subsequent to FIG. 12, FIG. 15 is a schematic drawing in a step subsequent to FIG. 13, FIG. 16 is a schematic drawing in a step subsequent to FIG. 14, FIG. 17 is a top view schematic drawing corresponding to FIG. 15 and FIG. 16, and FIG. 18 is a schematic drawing in a step subsequent to FIG. 16.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
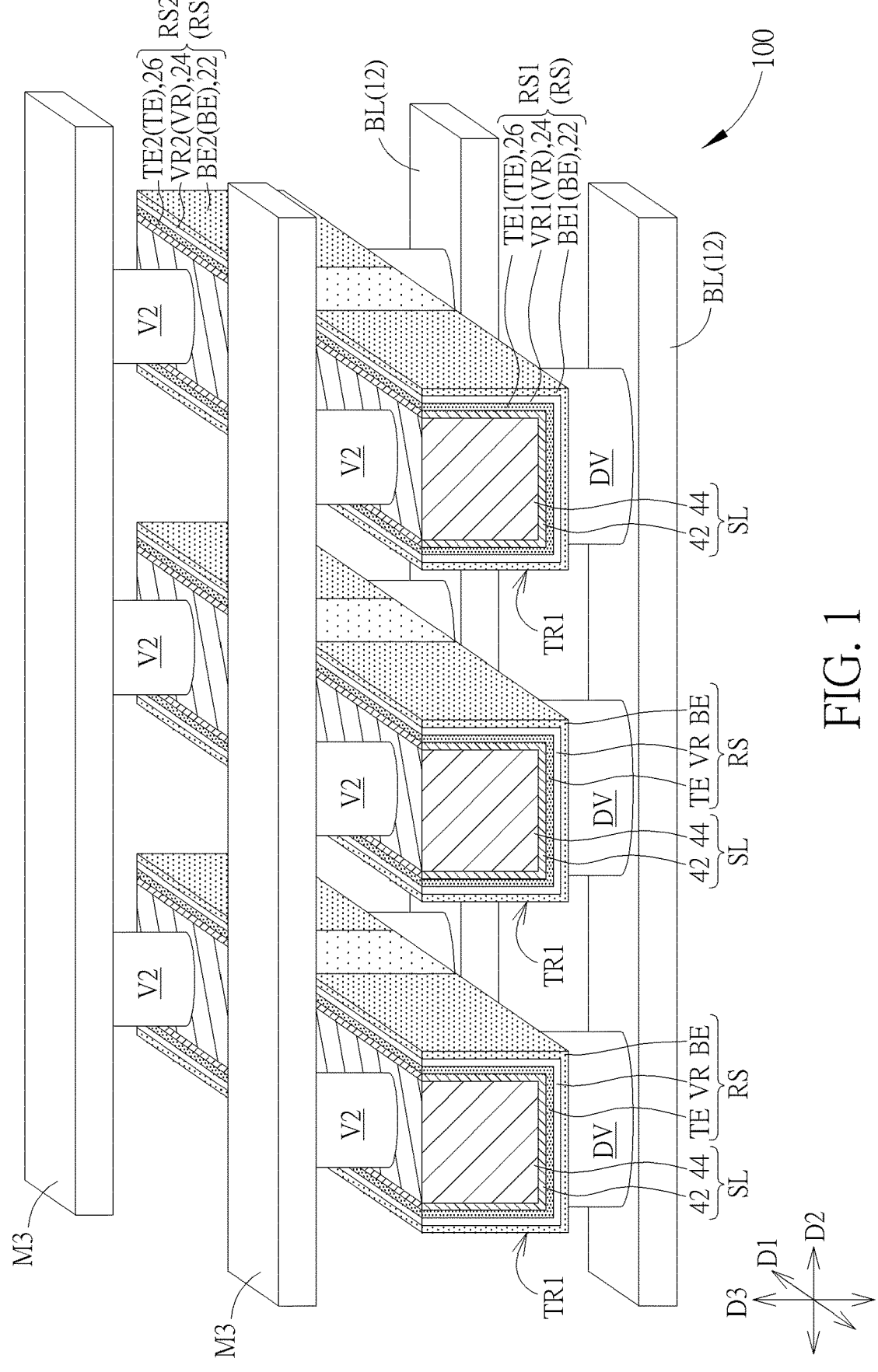
FIG. 1 is a stereoscopic schematic drawing illustrating a resistive memory device according to an embodiment of the present invention.
Figure 18:
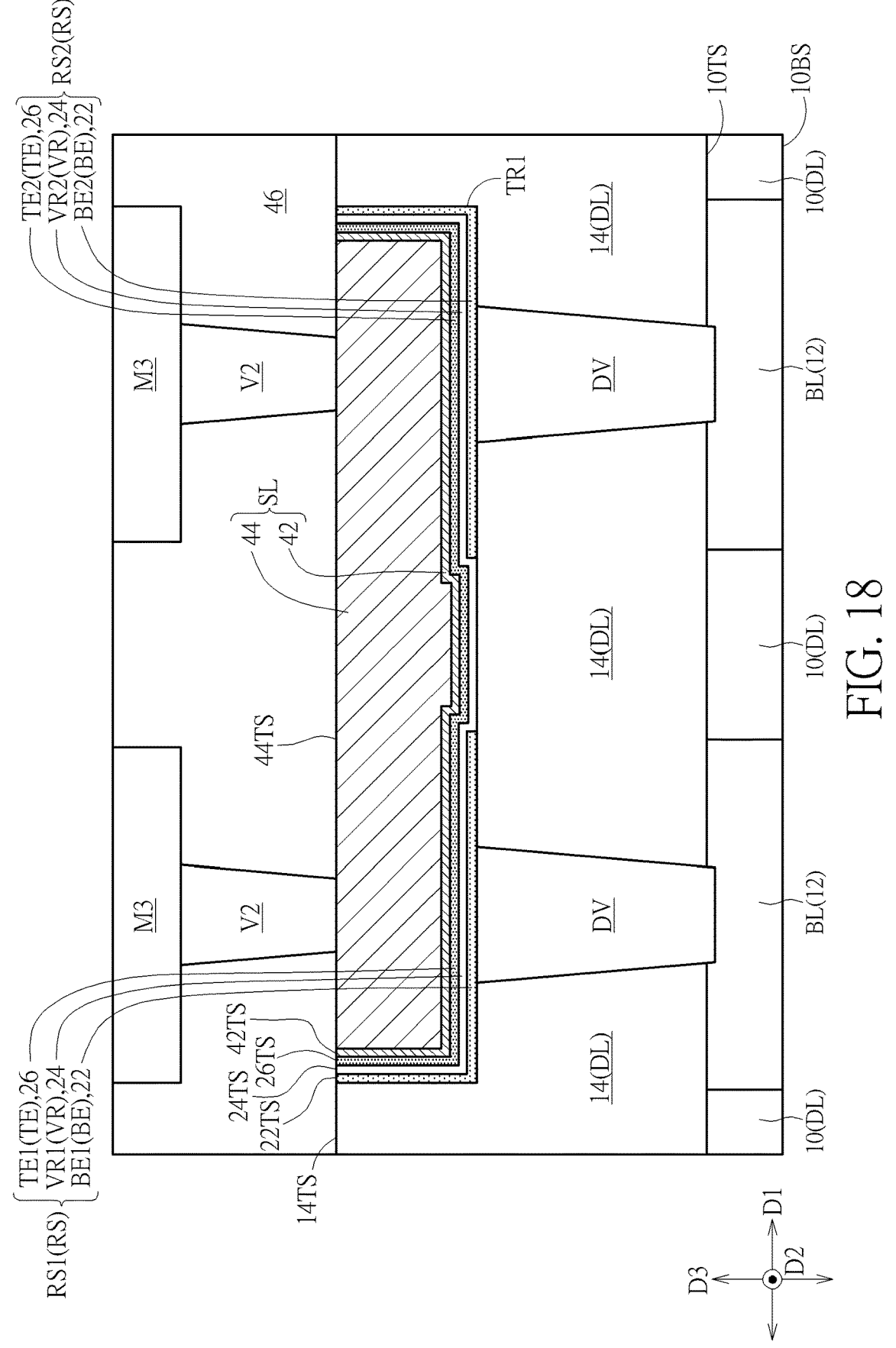

Please refer to FIG. 1 and FIG. 18. FIG. 1 is a stereoscopic schematic drawing illustrating a resistive memory device 100 according to an embodiment of the present invention, and FIG. 18 may be regarded as a cross-sectional schematic diagram of a part of the resistive memory device 100 (such as a cross-sectional schematic diagram taken along a line or a plane extending in a first horizontal direction D1 and penetrating through a trench TR1). As shown in FIG. 1 and FIG. 18, the resistive memory device 100 includes a dielectric layer DL, a trench TR1, a first resistive switching element RS1, a diode via structure DV, and a signal line structure SL. The trench TR1 is disposed in the dielectric layer DL, and the trench TR1 is elongated in the first horizontal direction D1. The first resistive switching element RS1 is disposed in the trench TR1, and the first resistive switching element RS1 includes a first bottom electrode BE1, a first top electrode TE1, and a first variable resistance layer VR1. The first top electrode TE1 is disposed above the first bottom electrode BE1, and the first variable resistance layer VR1 is disposed between the first bottom electrode BE1 and the first top electrode TE1. The diode via structure DV is disposed in the dielectric layer DL and located under the trench TR1 in a vertical direction D3, and the diode via structure DV is connected with the first bottom electrode BE1. The signal line structure SL is disposed in the trench TR1. A part of the signal line structure SL is disposed on the first resistive switching element RS1, and the signal line structure SL is electrically connected with the first top electrode TE1. The resistive switching element may have a three-dimensional (3D) configuration because the resistive switching element and the corresponding signal line structure SL located corresponding to the resistive switching element are disposed in the trench TR1. In addition, a manufacturing method of the resistive switching element and the signal line structure SL may be integrated with a manufacturing process of other conductive lines for simplifying the overall manufacturing processes.

In some embodiments, the resistive memory device 100 may further include a bit line structure BL disposed in the dielectric layer DL and located under the diode via structure DV in the vertical direction D3, and the bit line structure BL may be connected with the diode via structure DV. In some embodiments, the dielectric layer DL may include a plurality of dielectric material layers stacked in the vertical direction D3. For example, the dielectric layer DL may include a first layer 10 and a second layer 14 disposed on the first layer 10, the bit line structure BL may be disposed in the first layer 10 of the dielectric layer DL, and the diode via structure DV and the trench TR1 may be disposed in the second layer 14 of the dielectric layer DL, but not limited thereto. In addition, according to some design considerations, the first layer 10 and the second layer 14 may be respectively a single layer or multiple layers of dielectric materials, such as silicon oxide, silicon nitride, nitrogen doped carbide (NDC), silicon carbonitride, fluorosilicate glass (FSG), or other suitable dielectric materials (such as a low dielectric constant dielectric material having dielectric constant lower than 2.7, but not limited thereto). In some embodiments, the diode via structure DV may contact and be directly connected with the bit lint structure BL and the bottom electrode of the corresponding resistive switching element (such as the first bottom electrode BE1), and the signal line structure SL may contact and be directly connected with the top electrode of the corresponding resistive switching element (such as the first top electrode TE1). In some embodiments, the first layer 10 of the dielectric layer DL may be disposed on a substrate (not illustrated), and the substrate may include a semiconductor substrate, such as a silicon substrate, a silicon germanium substrate, a silicon-on-insulator (SOI) substrate, or a substrate made of other suitable materials. In addition, before the step of forming the first layer 10, other units (such as transistors) and/or other circuits (not illustrated) may be formed on the substrate described above, and the bit line structure BL may be electrically connected downwardly with the units and/or the circuits on the substrate, but not limited thereto. In some embodiments, the manufacturing method of the resistive memory device 100 may be integrated with the back end of line (BEOL) process in the semiconductor manufacturing process for process simplification, but not limited thereto.

In some embodiments, the resistive memory device 100 may include a plurality of the bit line structures BL, a plurality of the diode via structures DV, a plurality of the trenches TR1, and a plurality of resistive switching elements RS. The first resistive switching element RS1 may be regarded as one of the resistive switching elements RS, and each of the resistive switching elements RS may include a bottom electrode BE, a top electrode TE disposed above the bottom electrode BE, and a variable resistance layer VR disposed between the bottom electrode BE and the top electrode TE accordingly. Each of the trenches TR1 may be elongated in the first horizontal direction D1, and the trenches TR1 may be arranged repeatedly in a second horizontal direction D2 substantially orthogonal to the first horizontal direction D1, but not limited thereto. More than one resistive switching elements RS may be disposed in each trench TR1. For example, another resistive switching element RS disposed in the trench TR1 where the first resistive switching element RS1 described above is disposed may be regarded as a second resistive switching element RS2. In other words, the resistive memory device 100 may further include the second resistive switching element RS2 disposed in the trench TR1, and the second resistive switching element RS2 may include a second bottom electrode BE2, a second top electrode TE2, and a second variable resistance layer VR2. The second top electrode TE2 is disposed above the second bottom electrode BE2, and the second variable resistance layer VR2 is disposed between the second bottom electrode BE2 and the second top electrode TE2. Another part of the signal line structure SL may be disposed on the second resistive switching element RS2, and the signal line structure SL may be electrically connected with the second top electrode TE2.

In some embodiments, each of the bit line structure BL may be elongated in the second horizontal direction D2, and the bit line structures BL may be arranged repeatedly in the first horizontal direction D1. The bottom electrode BE of each of the resistive switching elements RS may be connected with the corresponding bit line structure BL via the diode via structure DV The bottom electrodes BE of the resistive switching elements RS disposed in the same trench TR1 may be connected to corresponding bit line structures BL, respectively, via different diode via structures DV, and one of the bit line structures BL may be connected with the bottom electrode BE of the resistive switching elements RS disposed in different trenches TR1 via different diode via structures DV In some embodiments, each of the diode via structures DV may include a p-type semiconductor layer and an n-type semiconductor layer (not illustrated) stacked in the vertical direction D3 for forming a diode structure between the corresponding bottom electrode BE and the corresponding bit line structure BL, but not limited thereto. In some embodiments, each of the diode via structures DV may include other suitable structures with diode characteristics. In addition, the p-type semiconductor layer described above may include a p-type silicon semiconductor layer, a p-type copper oxide (CuO) semiconductor layer, or other suitable p-type semiconductor materials, and the n-type semiconductor layer described above may include an n-type silicon semiconductor layer, an n-type indium zinc oxide (InZnO) semiconductor layer, or other suitable n-type semiconductor materials. The signal interference between the adjacent bit line structures BL may be reduced by disposing the diode via structures DV, the resistance state of the unspecified resistive switching element RS may be kept from being influenced when other specified resistive switching elements RS are in memory operation, and that is beneficial to the operation of the resistive memory device 100 accordingly.

In some embodiments, horizontal directions (such as the first horizontal direction D1 and the second horizontal direction D2) may be substantially orthogonal to the vertical direction D3, and the vertical direction D3 may be regarded as a thickness direction of the dielectric layer DL. The first layer 10 of the dielectric layer DL may have a top surface 10TS and a bottom surface 10BS opposite to the top surface 10TS in the vertical direction D3, and the second layer 14 may be disposed at the side of the top surface 10TS of the first layer 10. In this description, a distance between the bottom surface of the first layer 10 and a relatively higher location and/or a relatively higher part in the vertical direction D3 may be greater than a distance between the bottom surface 10BS of the first layer 10 and a relatively lower location and/or a relatively lower part in the vertical direction D3. The bottom or a lower portion of each component may be closer to the bottom surface 10BS of the first layer 10 in the vertical direction D3 than the top or upper portion of this component. Another component disposed above a specific component may be regarded as being relatively far from the bottom surface 10BS of the first layer 10 in the vertical direction D3, and another component disposed under a specific component may be regarded as being relatively close to the bottom surface 10BS of the first layer 10 in the vertical direction D3. It is worth noting that, in this description, a top surface of a specific component may include the topmost surface of this component in the vertical direction D3, and a bottom surface of a specific component may include the bottommost surface of this component in the vertical direction D3, but not limited thereto. Additionally, in this description, the condition that a certain component is disposed between two other components in a specific direction may include a condition that the certain component is sandwiched between the two other components in the specific direction, but not limited thereto.

In some embodiments, in a cross-sectional view of the resistive memory device 100 (such as a part of FIG. 1 or FIG. 15), the top electrode TE of each of the resistive switching elements RS (such as the first top electrode TE1) may include a U-shaped structure surrounding the corresponding signal line structure SL in the second horizontal direction D2, the variable resistance layer VR of each of the resistive switching elements RS (such as the first variable resistance layer VR1) may include a U-shaped structure surrounding the corresponding signal line structure SL and the top electrode TE (such as the first top electrode TE1) in the second horizontal direction D2, and the bottom electrode BE of each of the resistive switching elements RS (such as the first bottom electrode BE1) may include a U-shaped structure surrounding the corresponding signal line structure SL, the top electrode TE (such as the first top electrode TE1), and the variable resistance layer (such as the first variable resistance layer VR1) in the second horizontal direction D2. A part of each of the resistive switching elements RS (such as the first resistive switching element RS1) may be sandwiched between the signal line structure SL and the dielectric layer DL in the second horizontal direction D2, and another part of each of the resistive switching elements RS may be sandwiched between the signal line structure SL and the dielectric layer DL in the first horizontal direction D1 (as illustrated in FIG. 18). In other words, each of the resistive switching elements RS may be regarded as a 3D resistive switching element, the variable resistance layer VR may be sandwiched between the top electrode TE and the bottom electrode BE in the vertical direction D3 and in the horizontal directions (such as the first horizontal direction D1 and the second horizontal direction D2) for increasing the area of the variable resistance layer VR sandwiched between the top electrode TE and the bottom electrode BE without increasing the area occupied by the resistive switching element RS in the vertical direction D3, and that is beneficial to the operation characteristics and/or the disposition density of the resistive switching elements RS. In addition, as shown in FIG. 1 and FIG. 18, in each of the resistive switching elements RS (such as the first resistive switching element RS1), a top surface 26TS of the top electrode TE (such as the first top electrode TE1), a top surface 24TS of the variable resistance layer VR (such as the first variable resistance layer VR1), and a top surface 22TS of the bottom electrode BE (such as the first bottom electrode BE1) may be substantially coplanar, a top surface 14TS of the dielectric layer DL and the top surface 22TS of the bottom electrode BE (such as the first bottom electrode BE1) may be substantially coplanar, and a top surface (such as a top surface 42TS and/or a top surface 44TS) of the signal line structure SL and the top surface 26TS of the top electrode (such as the first top electrode TE1) may be substantially coplanar, but not limited thereto.

As shown in FIG. 1 and FIG. 18, in some embodiments, the first bottom electrode BE1 of the first resistive switching element RS1 and the second bottom electrode BE2 of the second resistive switching element RS2 may be regarded as different portions of a first electrically conductive layer 22 disposed in the trench TR1 and separated from each other without being directly connected with each other, the first variable resistance layer VR1 and the second variable resistance layer VR2 may be regarded as different portions of a variable resistance material 24 disposed in the trench TR1 and directly connected with each other, and the first top electrode TE1 and the second top electrode TE2 may be regarded as different portions of a second electrically conductive layer 26 disposed in the trench TR1 and directly connected with each other, but not limited thereto. The first electrically conductive layer 22 and the second electrically conductive layer 26 may respectively include a single layer or multiple layers of electrically conductive materials, such as platinum, tungsten, silver, copper, titanium, tantalum, iridium, an alloy of the materials described above, an electrically conductive nitride of the materials described above, or other suitable electrically conductive materials, and The variable resistance material 24 may include metal oxide, such as transition metal oxide, perovskite oxide, or other suitable variable resistance materials. In some embodiments, a part of the variable resistance material 24 and/or a part of the second electrically conductive layer 26 may be sandwiched between the first bottom electrode BE1 and the second bottom electrode BE2 in the first horizontal direction D1, but not limited thereto. In some embodiments, the signal line structure SL may include a barrier layer 42 and a metal layer 44 disposed in the barrier layer 42. The barrier layer 42 may be sandwiched between the metal layer 44 and the second electrically conductive layer 26, and the thickness of the metal layer 44 may be greater than the thickness of the barrier layer 42, the thickness of the second electrically conductive layer 26, the thickness of the variable resistance material 24, and the thickness of the first electrically conductive layer 22. The barrier layer 42 may include titanium nitride, tantalum nitride, other suitable electrically conductive barrier materials, and the metal layer 44 may include a metallic electrically conductive material with relatively low electrical resistivity, such as copper, aluminum, tungsten, and so forth, but not limited thereto.

As shown in FIG. 1 and FIG. 18, in some embodiments, the resistive memory device 100 may further include a dielectric layer 46, a plurality of via structures V2, and a plurality of conductive lines M3. The dielectric layer 46 may be disposed on the dielectric layer DL, the resistive switching elements RS, and the signal line structures SL, and the dielectric layer 46 may include a single layer or multiple layers of dielectric materials, such as silicon oxide, silicon nitride, nitrogen doped carbide, silicon carbonitride, fluorosilicate glass, or other suitable dielectric materials (such as a low dielectric constant dielectric material, but not limited thereto). The via structure V2 and the conductive line M3 may be disposed in the dielectric layer 46, and the conductive line M3 may be disposed on the via structure V2. In some embodiments, each of the conductive lines M3 may be substantially elongated in the second horizontal direction D2, and the conductive lines M3 may be arranged repeatedly in the first horizontal direction D1. The via structures V2 may include via conductors and may contact and electrically connected with the corresponding signal line structures SL and the corresponding conductive lines M3, respectively, and the conductive line M3 may be electrically connected with the top electrode TE of the corresponding resistive switching element RS via the via structure V2 and the signal line structure SL. In some embodiments, the via structure V2, the conductive line M3, and the bit line structure BL may respectively include a barrier layer and a low electrical resistivity material disposed on the barrier layer. The low electrical resistivity material may include an electrically conductive material with relative low electrical resistivity, such as copper, aluminum, tungsten, and so forth, and the barrier layer may include titanium nitride, tantalum nitride, or other suitable electrically conductive barrier materials, but not limited thereto. Because the conductive line M3 and the bit line structure BL are electrically connected to the top electrode TE and the bottom electrode BE of the resistive switching element RS, respectively, suitable voltages may be applied to the top electrode TE and the bottom electrode BE, respectively, for changing the resistance of the resistive switching element RS, and the resistive switching element RS may switch between high resistance state (HRS) and low resistance state (LRS) for realizing the operation mode of the memory device, such as storing data, reading data, and resetting.

Figure 2:
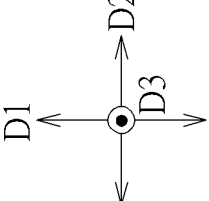
Figure 3:
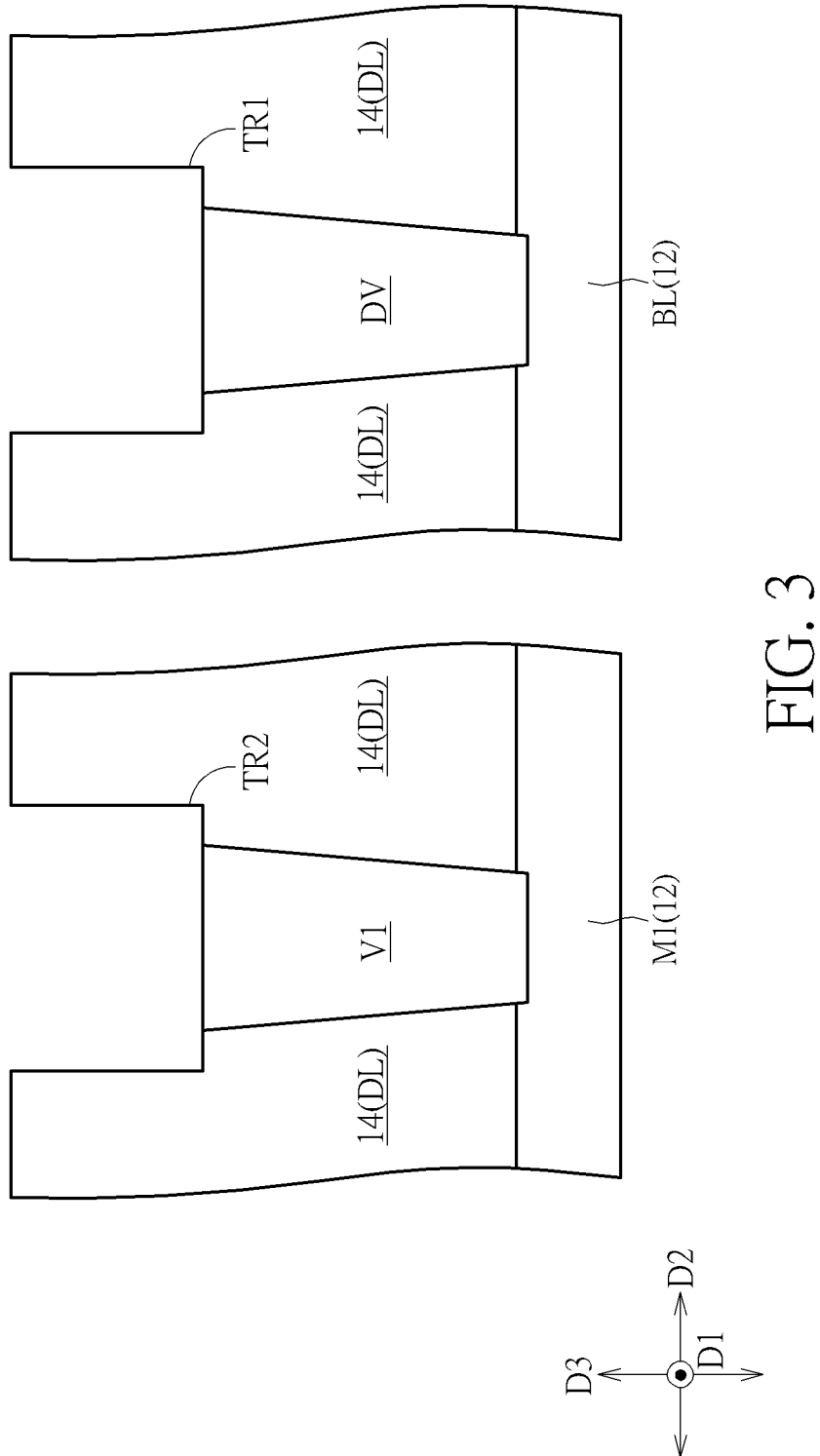
Figure 4:
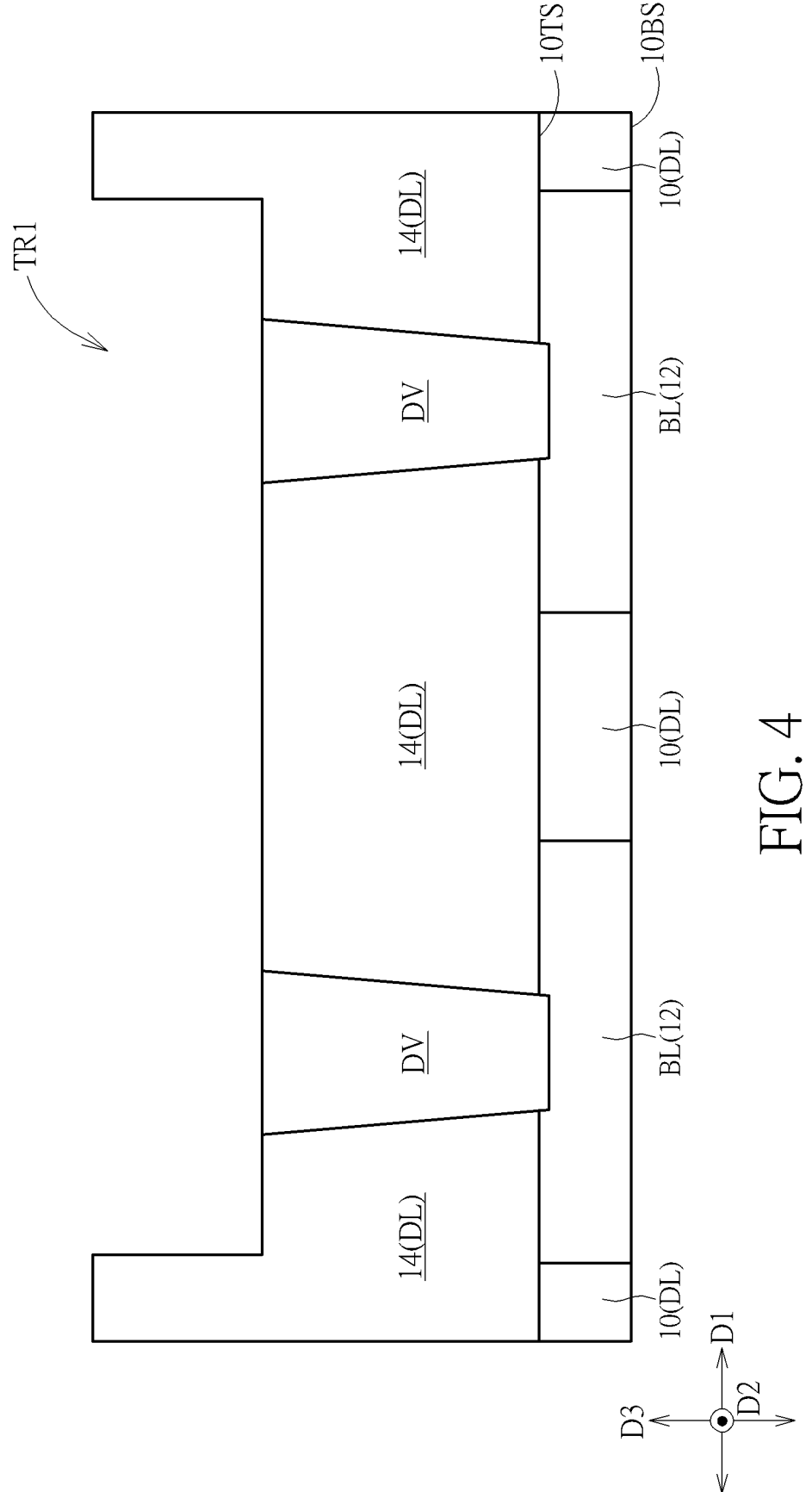
Figure 5:
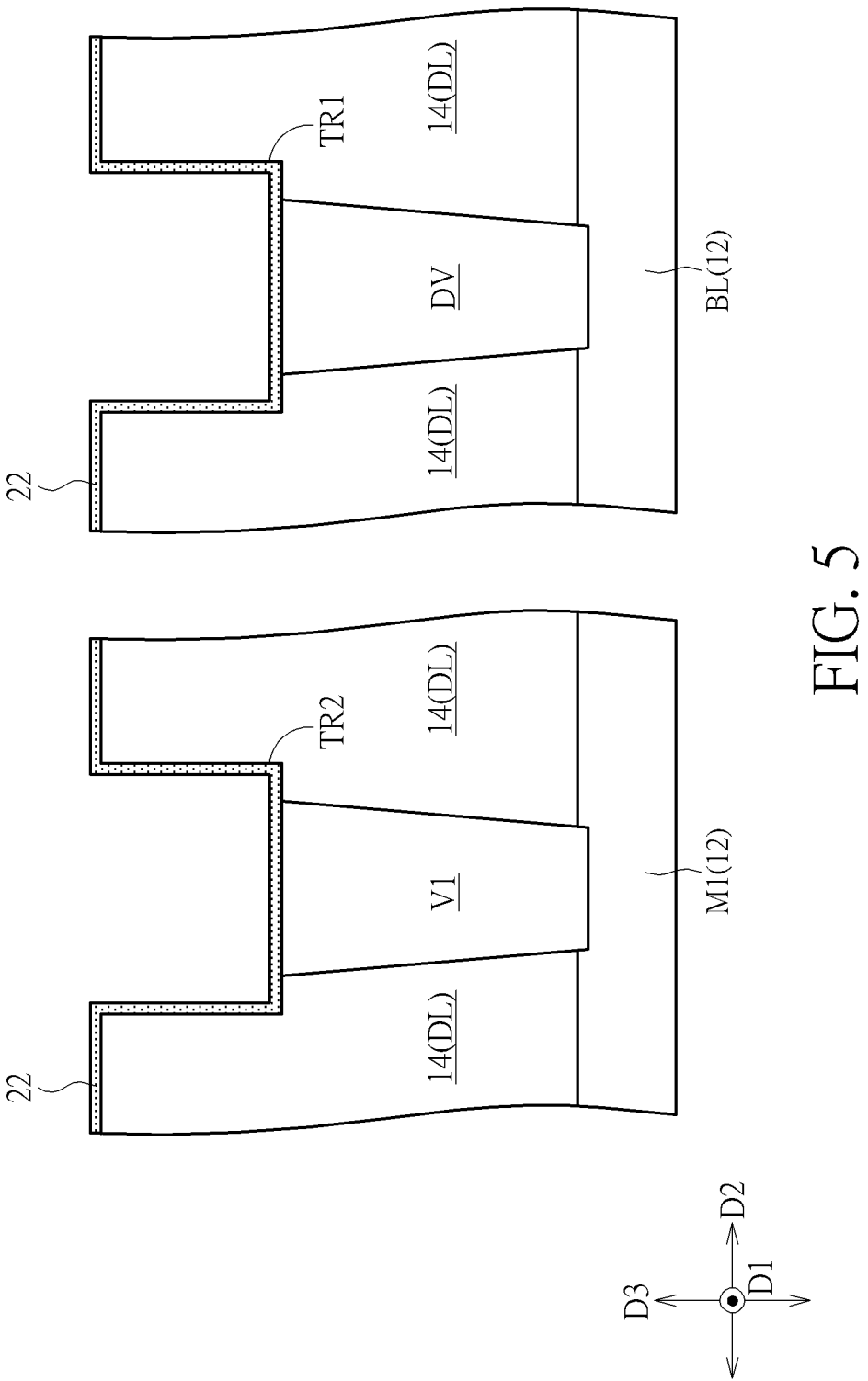
Figure 6:
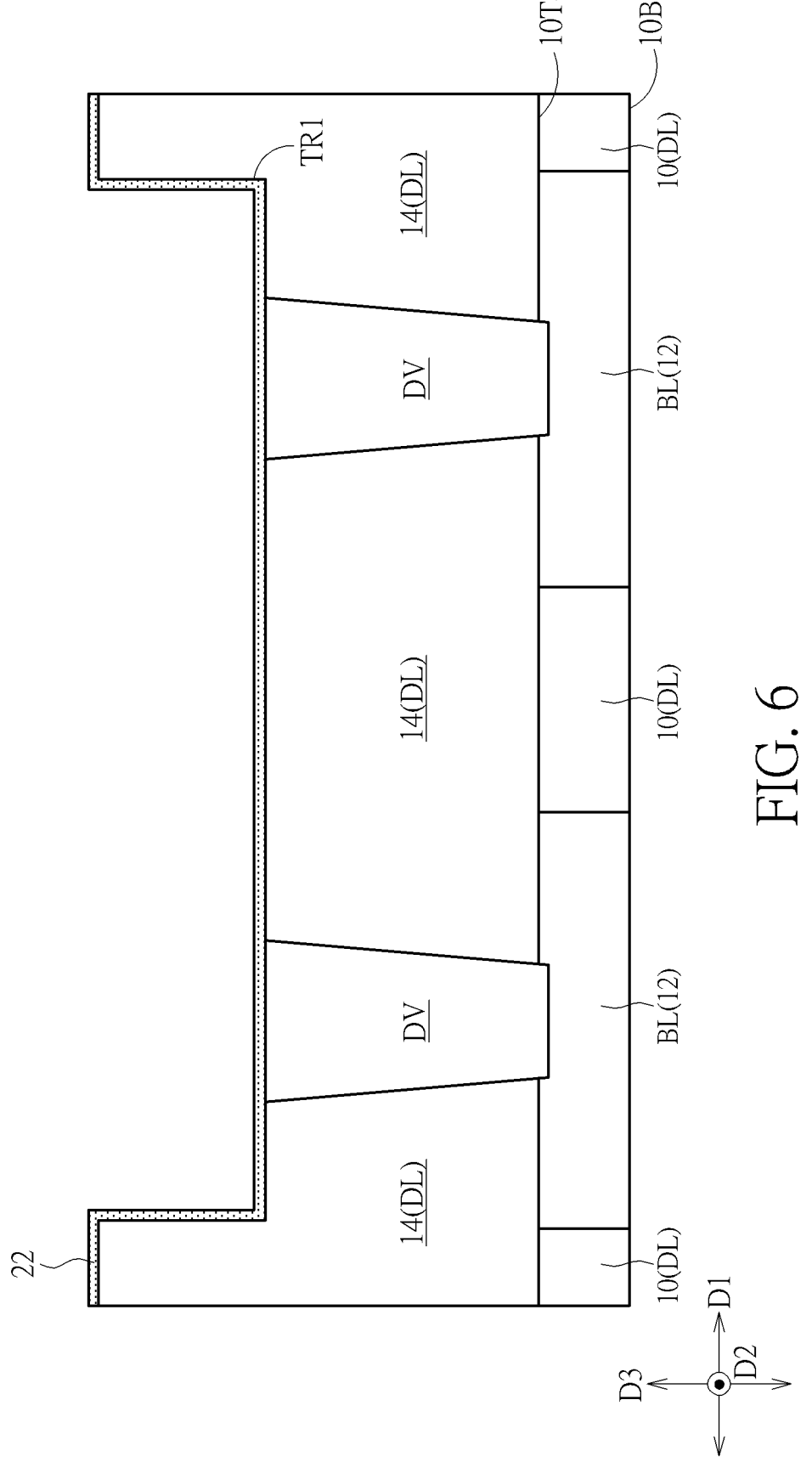
Figure 7:
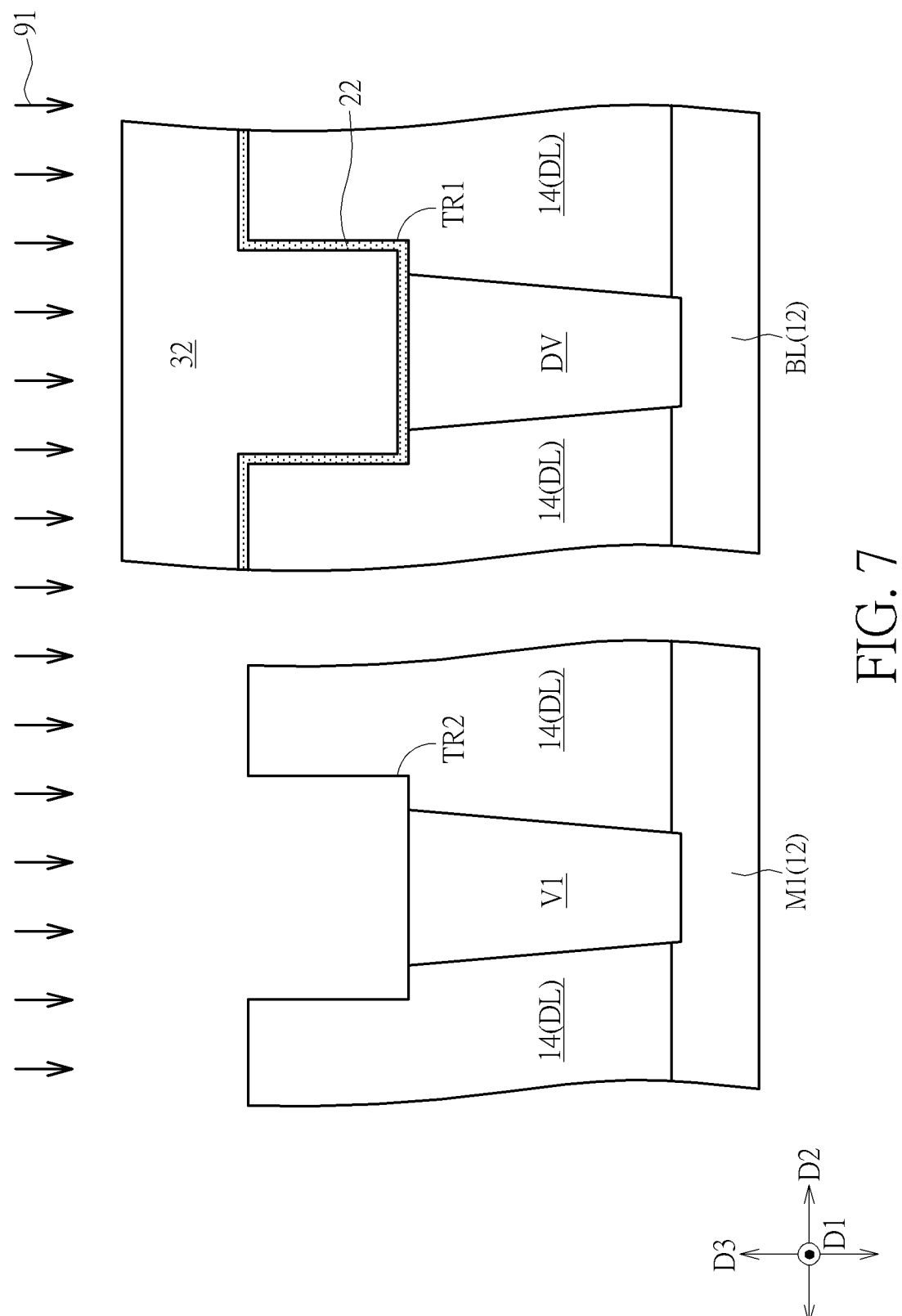
Figure 8:
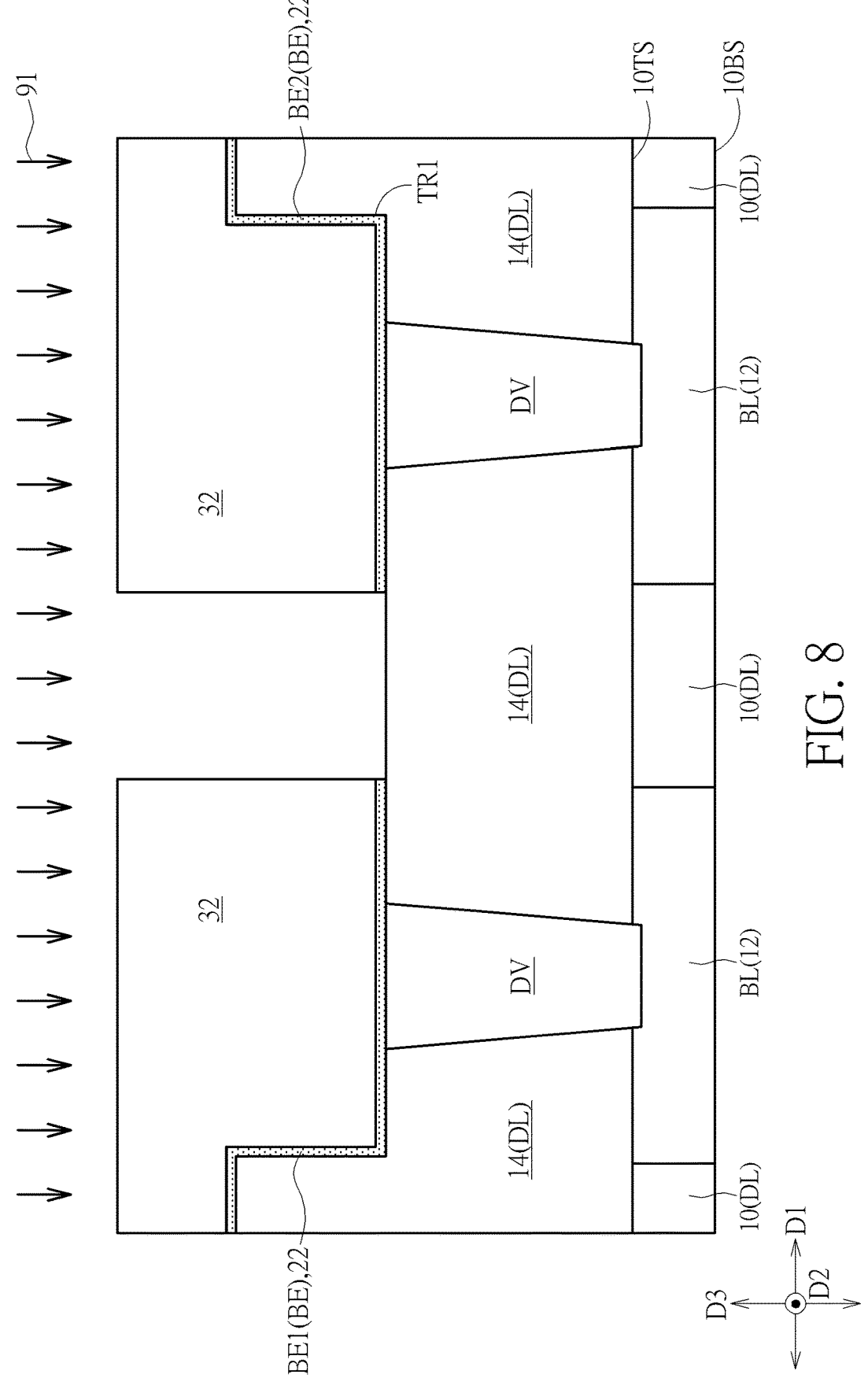
Figure 9:
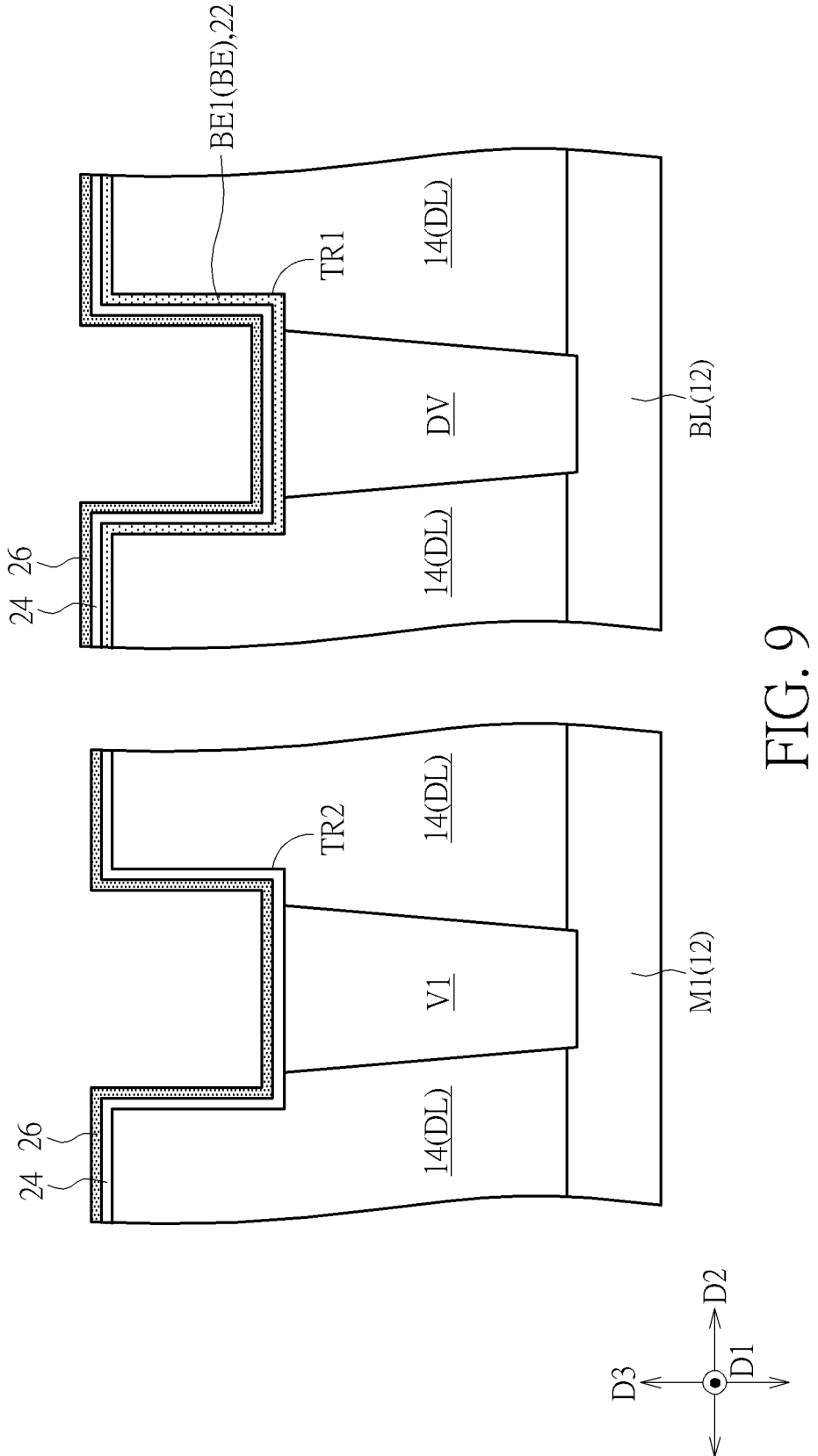
Figure 10:
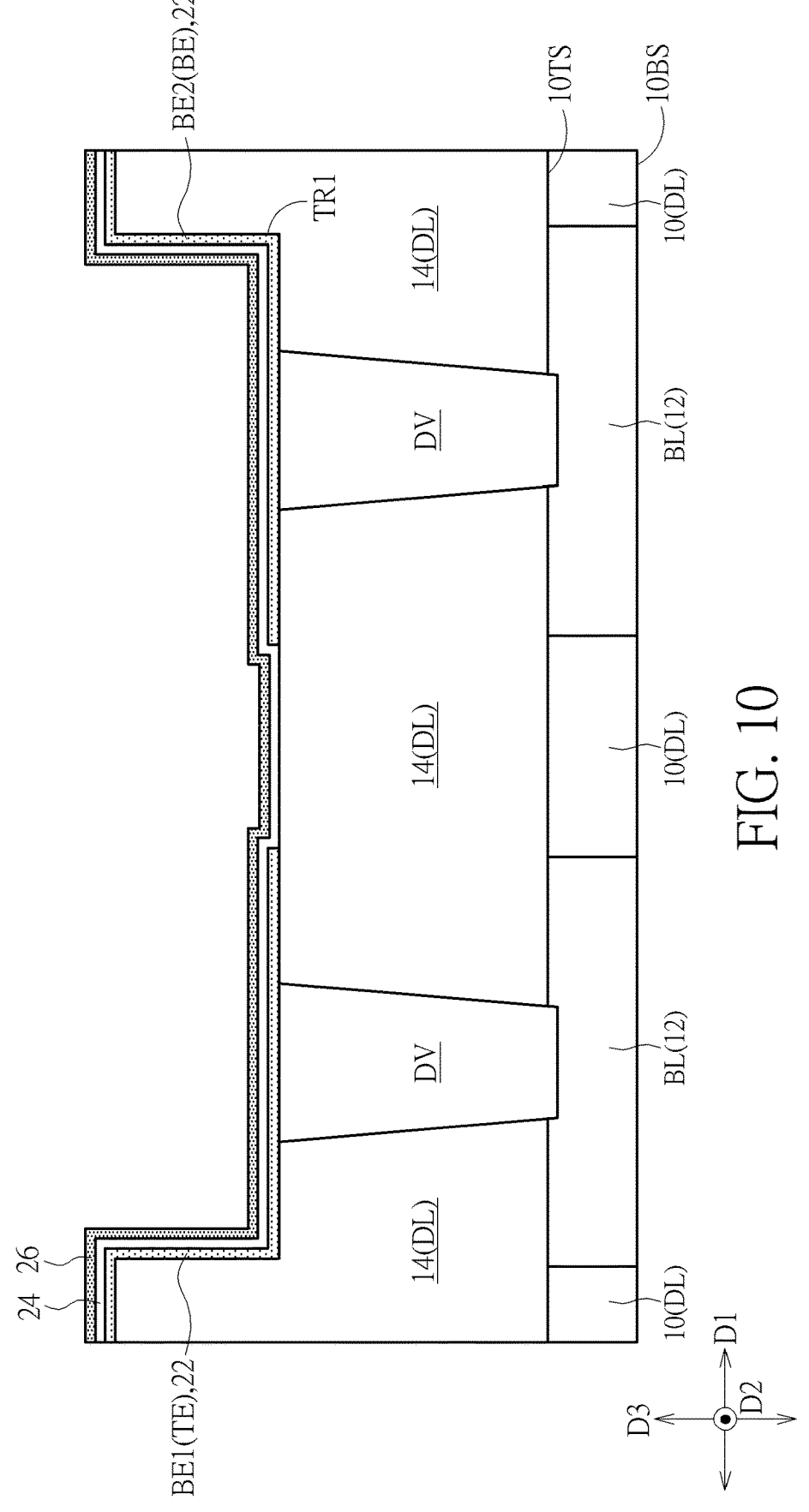
Figure 11:
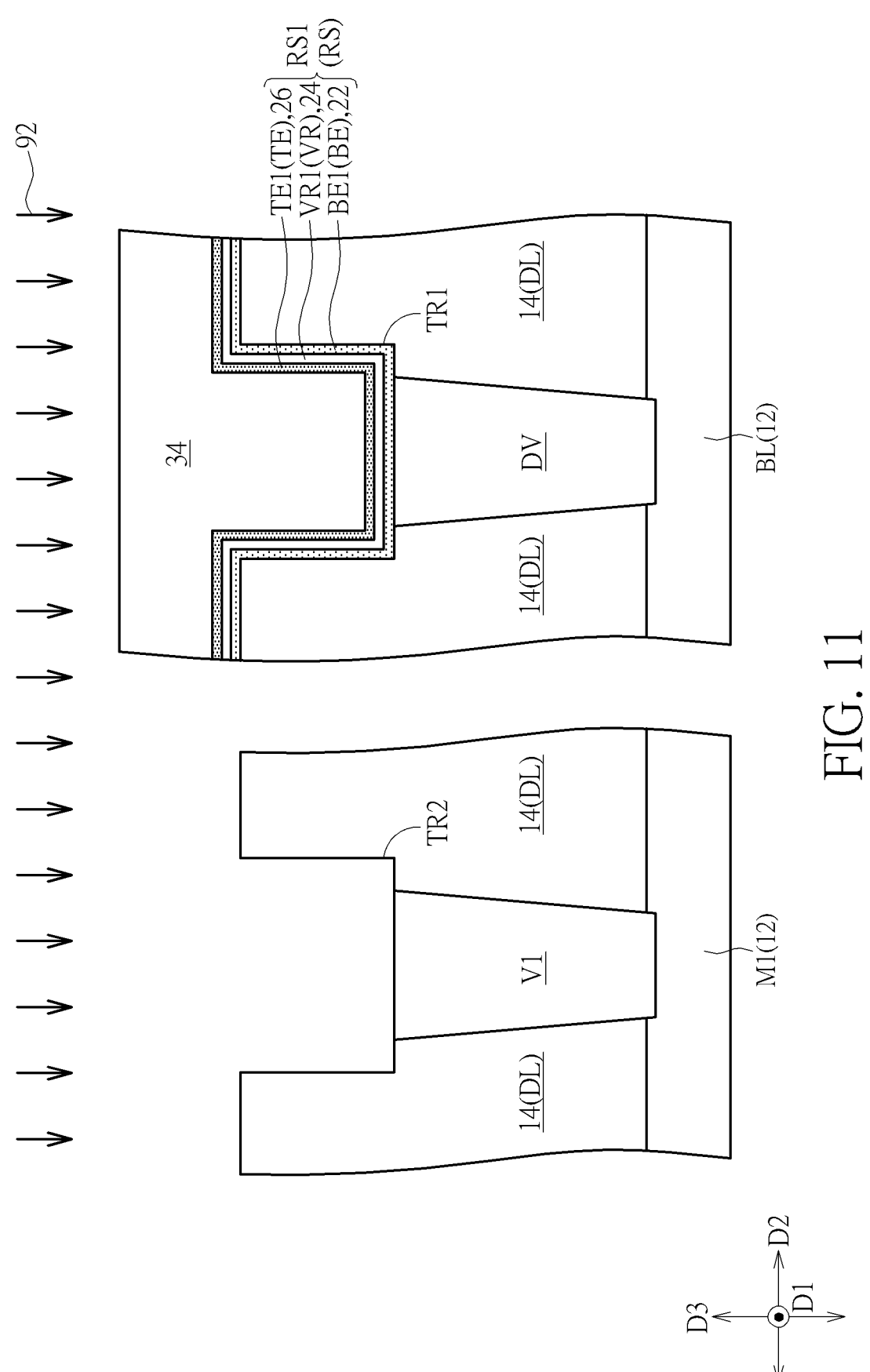
Figure 12:
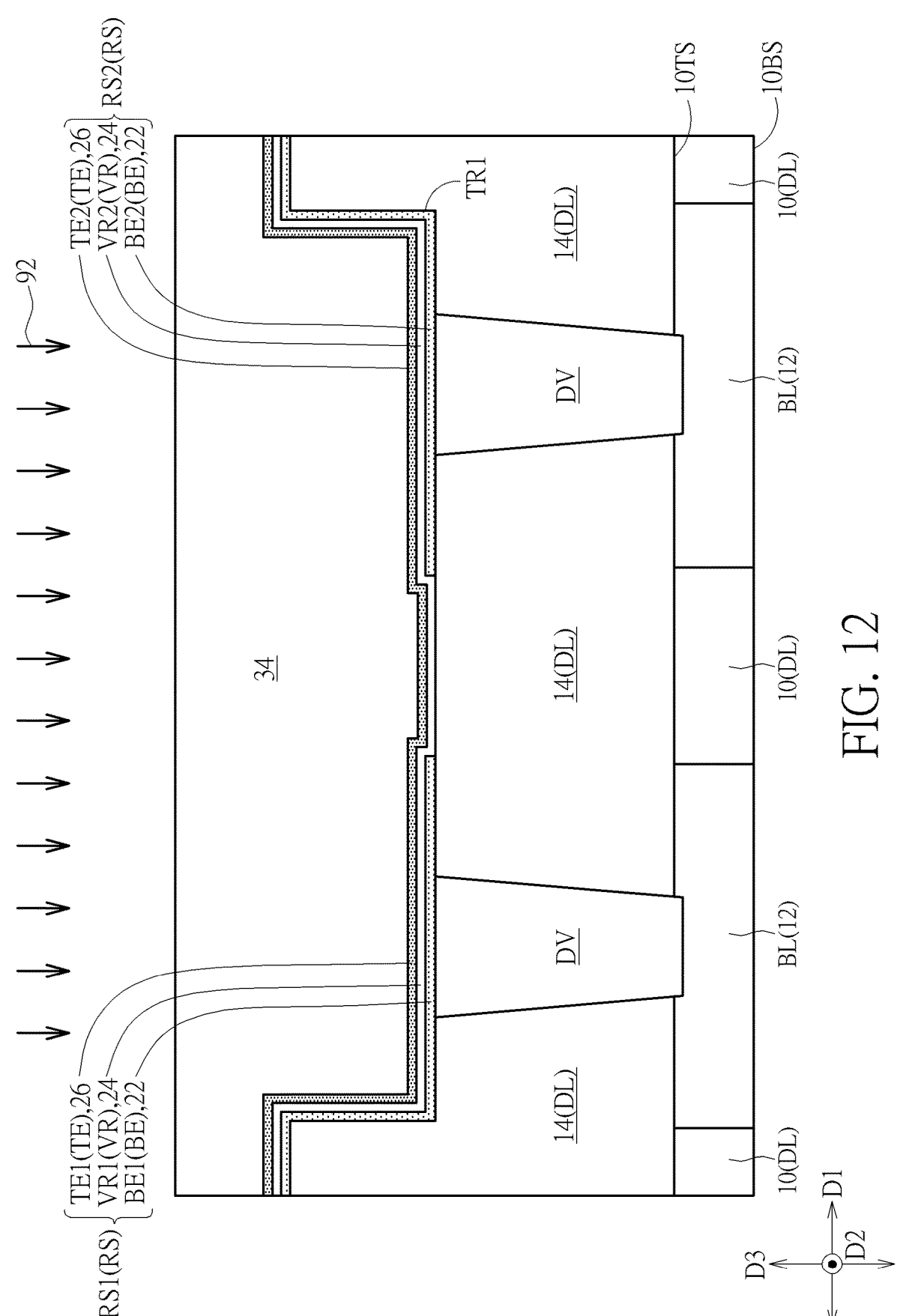
Figure 13:
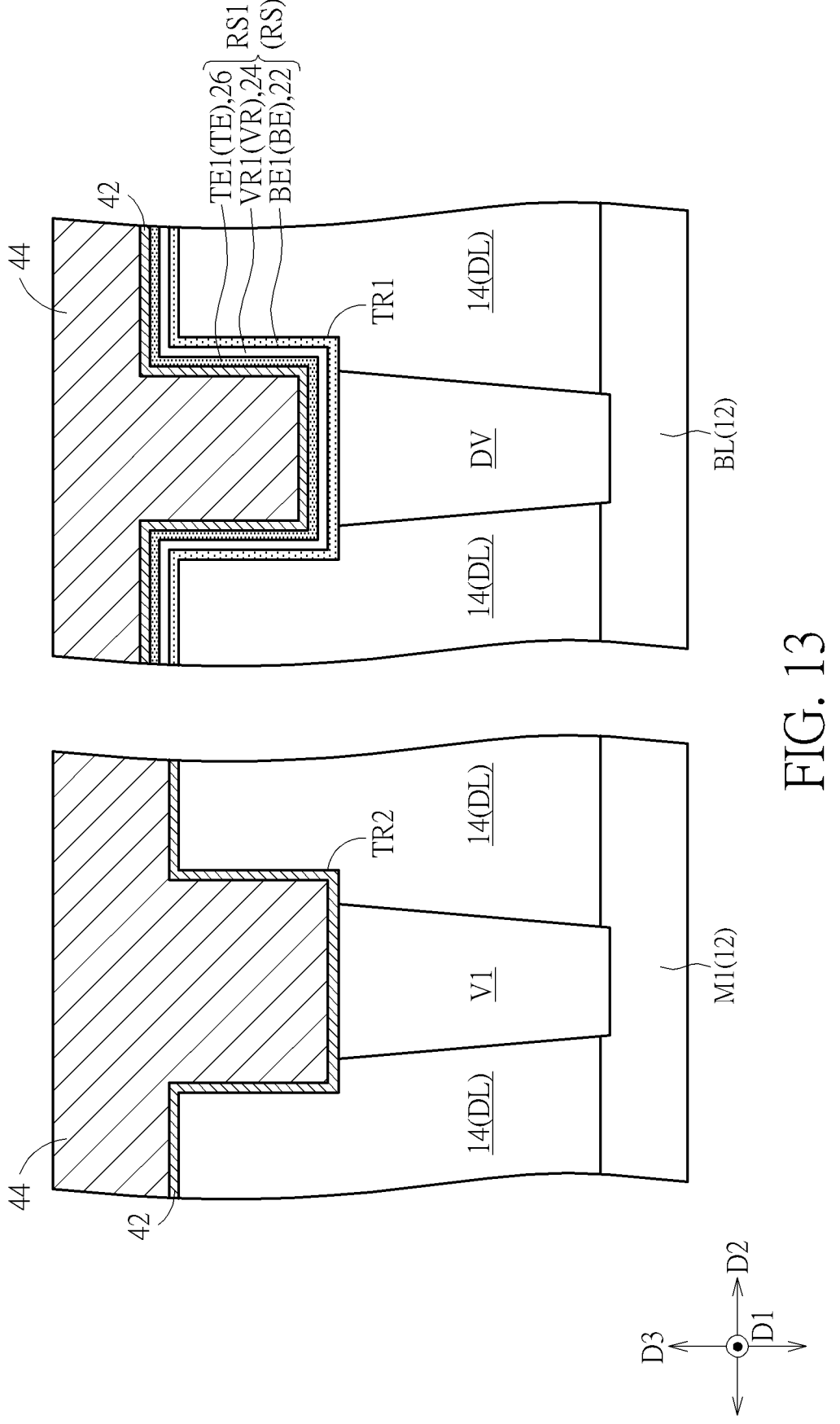
Figure 14:
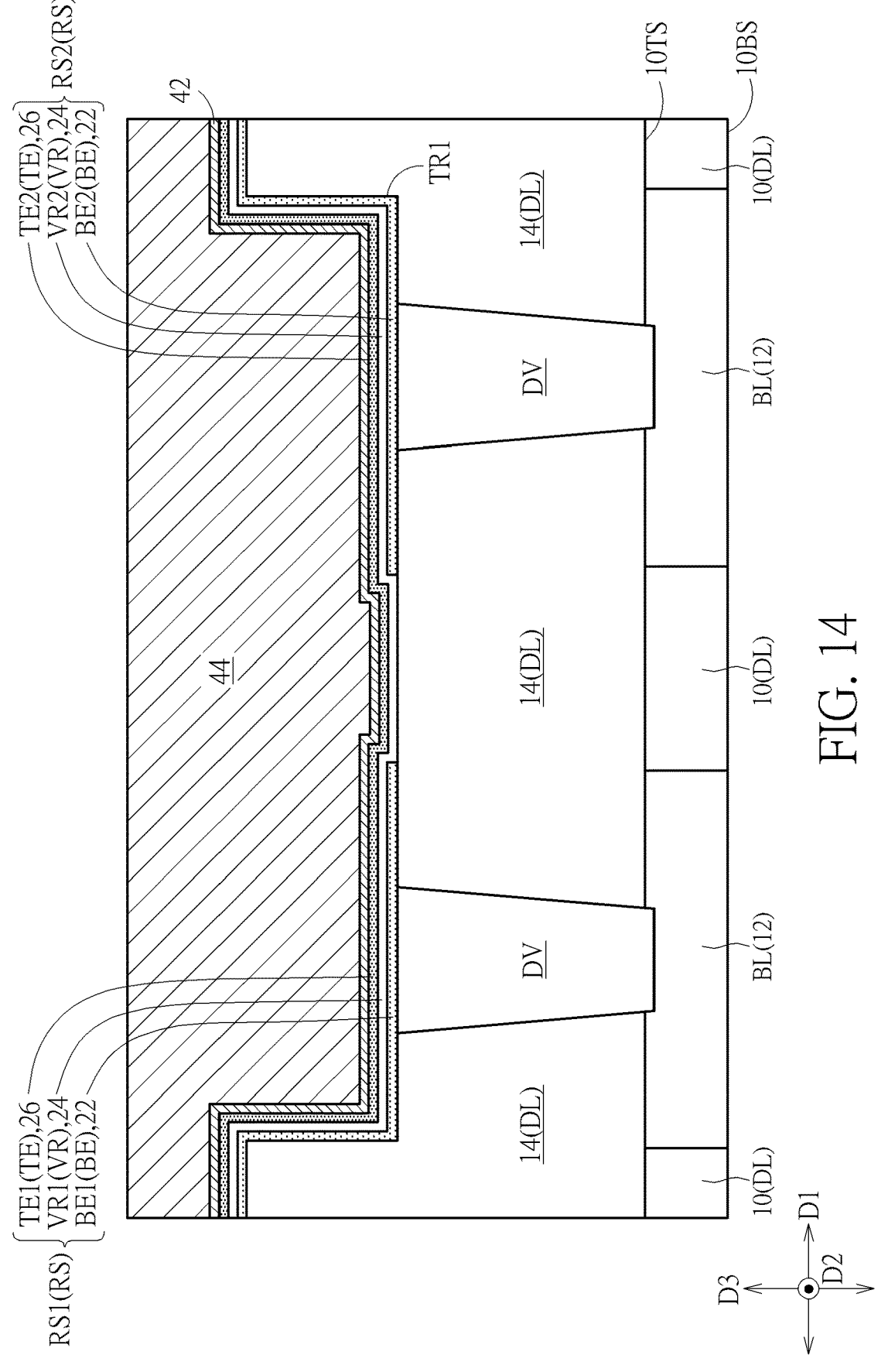
Figure 15:
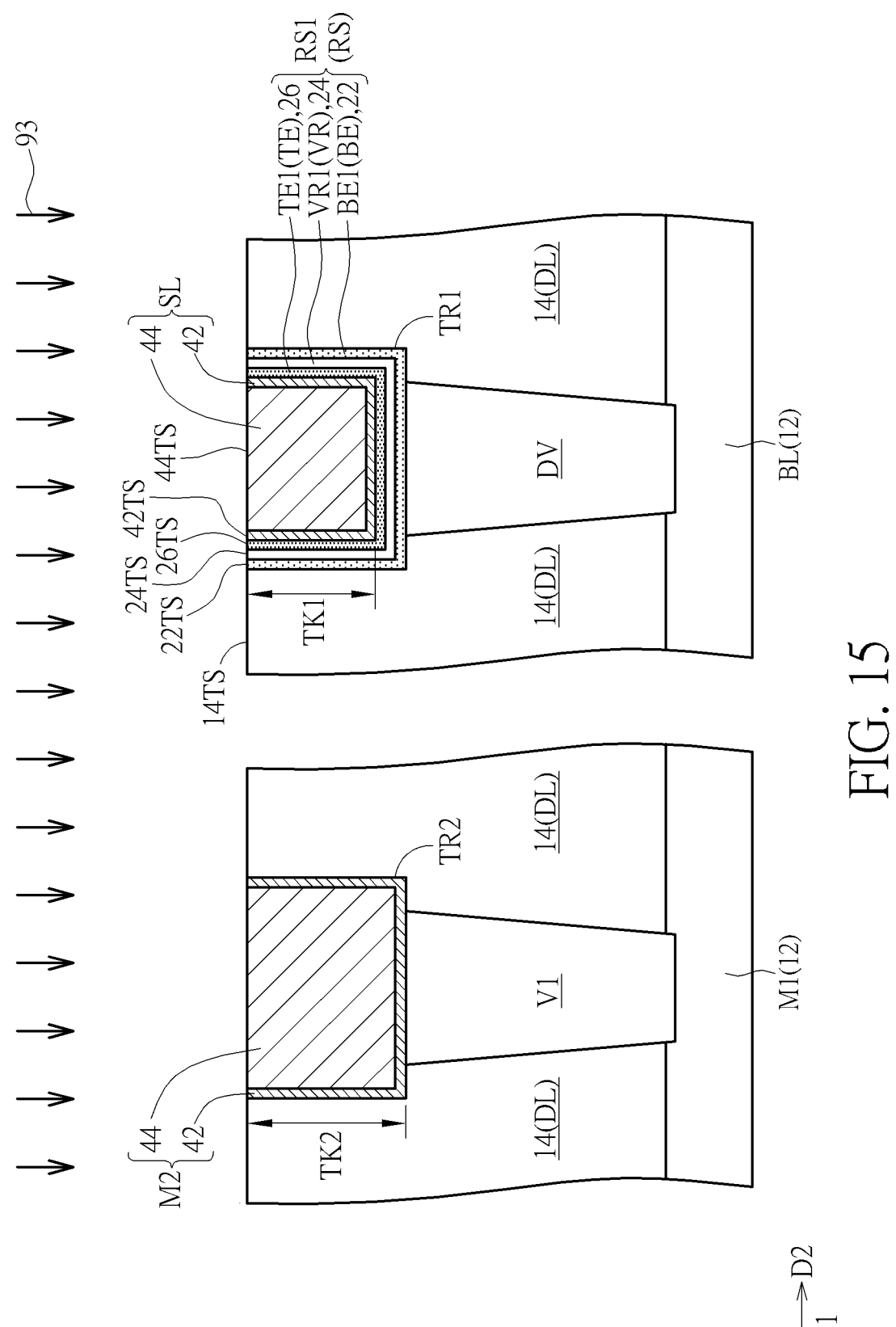
Figure 16:
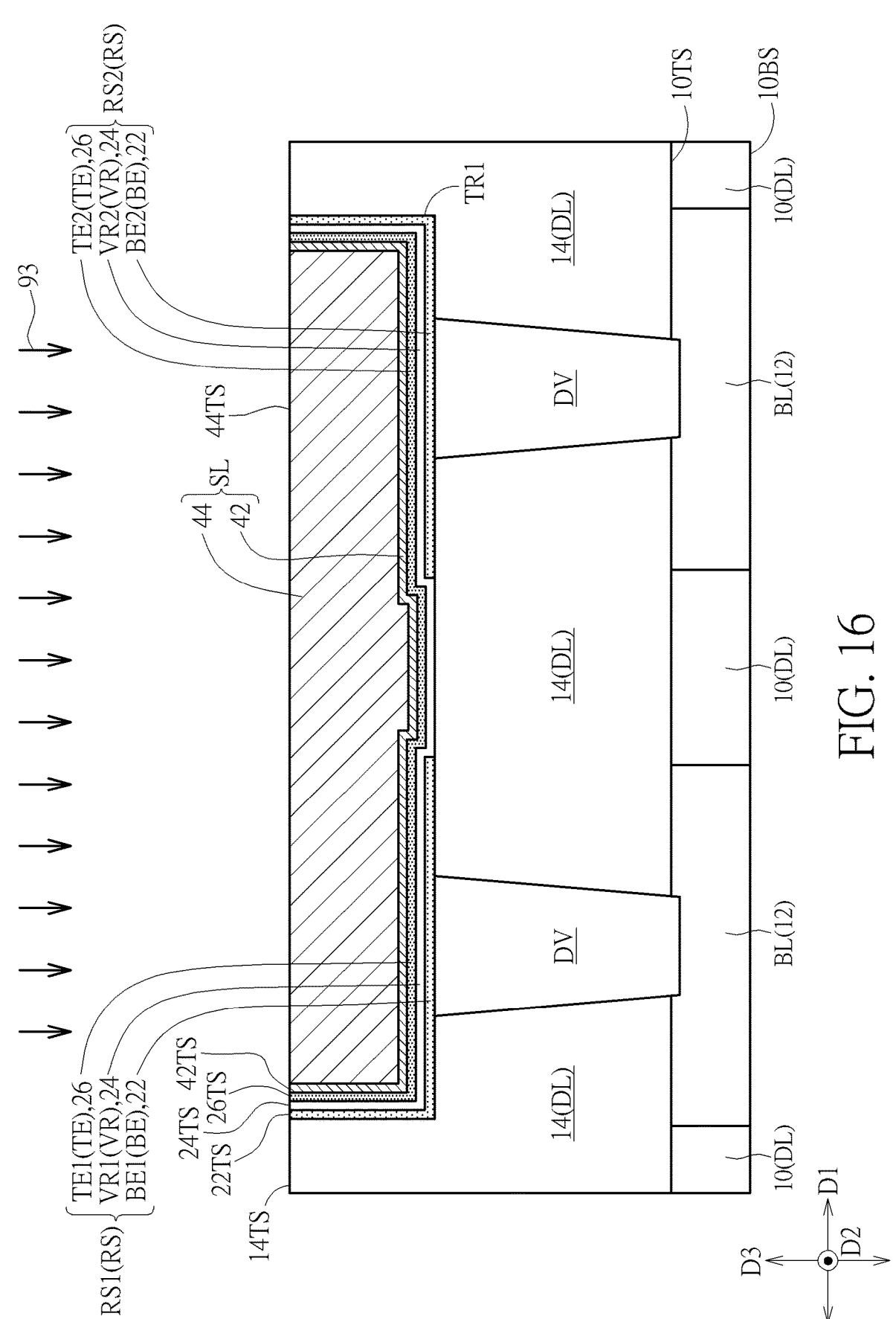
Figure 17:
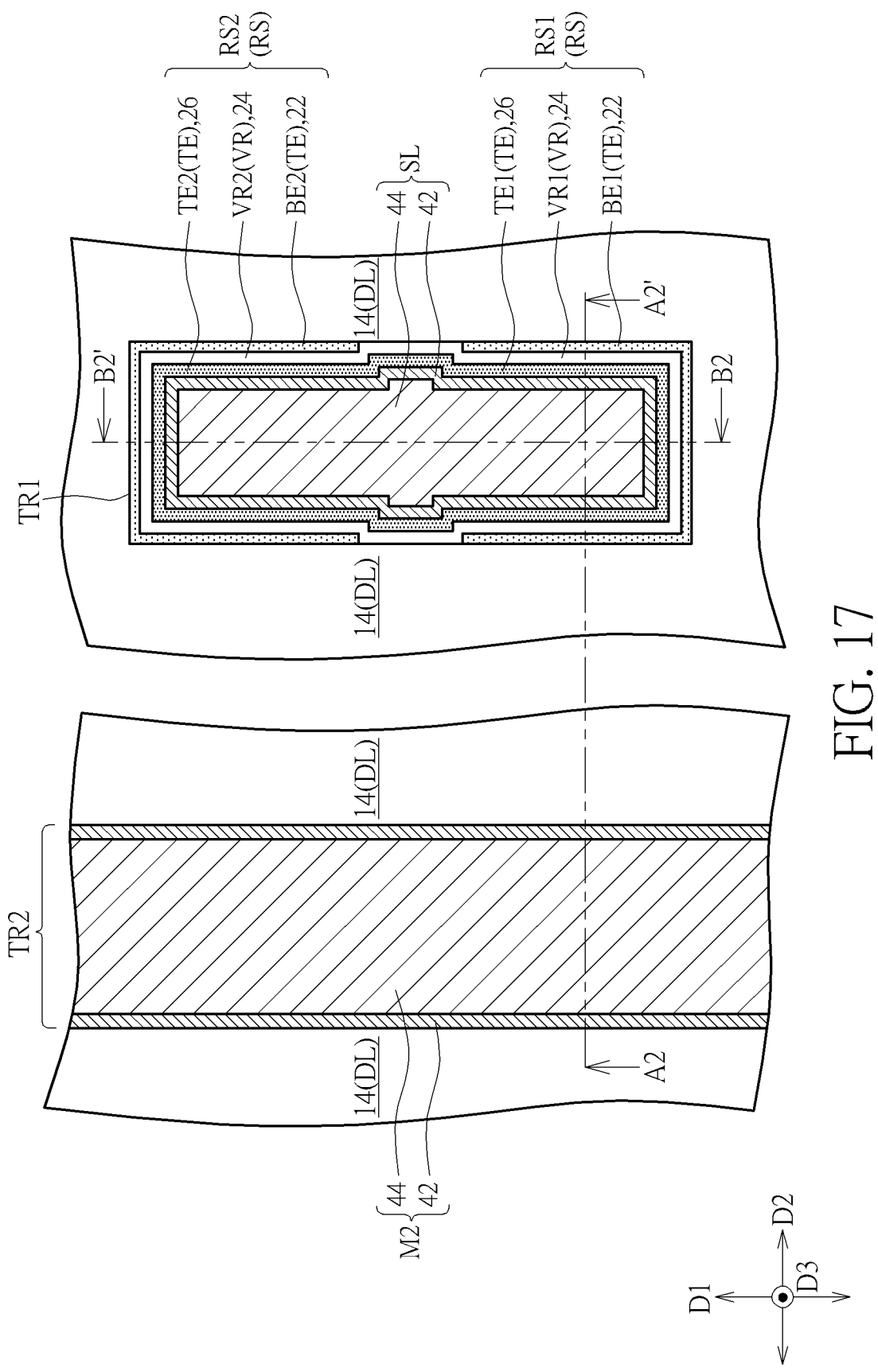

Please refer to FIG. 1 and FIGS. 2-18. FIGS. 2-18 are schematic drawings illustrating a manufacturing method of a resistive memory device according to an embodiment of the present invention, wherein FIG. 2 is a top view schematic drawing, FIG. 3 is a cross-sectional schematic diagram taken along a line A1-A1' in FIG. 2, FIG. 4 is a cross-sectional schematic diagram taken along a line B1-B1' in FIG. 2, FIG. 5 is a schematic drawing in a step subsequent to FIG. 3, FIG. 6 is a schematic drawing in a step subsequent to FIG. 4, FIG. 7 is a schematic drawing in a step subsequent to FIG. 5, FIG. 8 is a schematic drawing in a step subsequent to FIG. 6, FIG. 9 is a schematic drawing in a step subsequent to FIG. 7, FIG. 10 is a schematic drawing in a step subsequent to FIG. 8, FIG. 11 is a schematic drawing in a step subsequent to FIG. 9, FIG. 12 is a schematic drawing in a step subsequent to FIG. 10, FIG. 13 is a schematic drawing in a step subsequent to FIG. 11, FIG. 14 is a schematic drawing in a step subsequent to FIG. 12, FIG. 15 is a schematic drawing in a step subsequent to FIG. 13, FIG. 16 is a schematic drawing in a step subsequent to FIG. 14, FIG. 17 is a top view schematic drawing corresponding to FIG. 15 and FIG. 16, and FIG. 18 is a schematic drawing in a step subsequent to FIG. 16. In some embodiments, FIG. 15 may be regarded as a cross-sectional schematic diagram taken along a line A2-A2' in FIG. 17, FIG. 16 may be regarded as a cross-sectional schematic diagram taken along a line B2-B2' in FIG. 17, and FIG. 1 may be regarded as a stereoscopic schematic drawing in a step subsequent to FIG. 18, but not limited thereto. As shown in FIG. 1 and FIG. 18, the manufacturing method of the resistive memory device 100 in this embodiment may include the following steps. The diode via structure DV is formed in the dielectric layer DL. A first trench (such as the trench TR1) is formed in the dielectric layer DL, and the diode via structure DV is located under the trench TR1. The first resistive switching element RS1 is formed in the trench TR1. The first resistive switching element RS1 includes the first bottom electrode BE1, the first top electrode TE1, and the first variable resistance layer VR1. The diode via structure DV is connected with the first bottom electrode BE1, the first top electrode TE1 is disposed above the first bottom electrode BE1, and the first variable resistance layer VR1 is disposed between the first bottom electrode BE1 and the first top electrode TE1. The signal line structure SL is formed in the trench TR1, a part of the signal line structure SL is formed on the first resistive switching element RS1, and the signal line structure SL is electrically connected with the first top electrode TE1.

Specifically, the manufacturing method of the present invention may include but is not limited to the following steps. As shown in FIGS. 2-4, in some embodiments, after the steps of forming the bit line structure BL and the diode via structure DV, the trench TR1 may be formed in the dielectric layer DL, and the trench TR1 may exposed at least a part of the diode via structure DV. Additionally, in some embodiments, the manufacturing method may further include forming a conductive line M1 and a via structure V1. The conductive line M1 and the via structure V1 may be located in the dielectric layer DL, the conductive line M1 may be located under the via structure V1 in the vertical direction D3, and the conductive line M1 may be connected with the via structure V1. In some embodiments, the conductive line M1 and the bit line structure BL may be formed concurrently by the same process and have the same material composition (such as an electrically conductive material 12), the opening corresponding to the via structure V1 and the opening corresponding to the diode via structure DV may be formed concurrently by the same process, but the material composition of the via structure V1 is different to the material composition of the diode via structure DV. For example, the material composition of the via structure V1 may be identical to or similar to that of the via structure V3 in FIG. 1 described above, but not limited thereto. Additionally, in some embodiments, after the steps of forming the conductive line M1 and the via structure V1, a second trench (such as a trench TR2) may be formed in the dielectric layer DL, and the trench TR2 exposes at least a part of the via structure V1. In some embodiments, the trench TR2 may be elongated substantially in the first horizontal direction D1, and the trench TR1 and the trench TR2 may be formed concurrently by the same process, but not limited thereto. Additionally, when resistive switching elements have to be formed in the trench TR1 in the subsequent processes, the trench TR1 may be located corresponding to more than one diode via structure DV, and the trench TR1 may expose at least a part of each of the diode via structures.

Subsequently, as shown in FIG. 5 and FIG. 6, the first electrically conductive layer 22 may be formed on the dielectric layer DL. The first electrically conductive layer 22 may be formed conformally on the surface of the dielectric layer DL and formed conformally on the trench TR1 and the trench TR2. Therefore, the first electrically conductive layer 22 may be partly formed in the trench TR1 and the trench TR2 and partly formed outside the trench TR1 and the trench TR2. As shown in FIG. 7 and FIG. 8, a first patterning process 91 may be performed to the first electrically conductive layer 22, the first electrically conductive layer 22 located in the trench TR2 may be removed by the first patterning process 91, a part of the first electrically conductive layer 22 may be patterned to be the first bottom electrode BE1 by the first patterning process 91, and another part of the first electrically conductive layer 22 may be patterned to be the second bottom electrode BE2 by the first patterning process 91. Apart of the first electrically conductive layer 22 located in the trench TR1 may be removed by the first patterning process 91 for separating the first bottom electrode BE1 and the second bottom electrode BE2. In some embodiments, a patterned photoresist layer 32 may be formed on the first electrically conductive layer 22, an etching process using the patterned photoresist layer 32 as an etching mask may be performed to the first electrically conductive layer 22 for generating the patterning effect, and the patterned photoresist layer 32 may be removed after the first patterning process 91, but not limited thereto. As shown in FIGS. 7-10, after the first patterning process 91, the variable resistance material 24 may be formed, and the second electrically conductive layer 26 may be formed on the variable resistance material 24. The variable resistance material 24 may be formed conformally on the first bottom electrode BE1, the second bottom electrode BE2, and the dielectric layer DL, and the second electrically conductive layer 26 may be formed conformally on the variable resistance material 24. The variable resistance material 24 may be formed partly in the trench TR1 and the trench TR2 and formed partly outside the trench TR1 and the trench TR2, and the second electrically conductive layer 26 may be formed partly in the trench TR1 and the trench TR2 and formed partly outside the trench TR1 and the trench TR2. It is worth noting that, the trench is not fully filled with the first electrically conductive layer 22, the variable resistance material 24, and the second electrically conductive layer 26 for keeping space for the signal line structure formed subsequently.

As shown in FIG. 11 and FIG. 12, a second patterning process 92 may then be performed. a part of the second electrically conductive layer 26 may be patterned to be the first top electrode TE1 by the second patterning process 92, another part of the second electrically conductive layer 26 may be patterned to be the second top electrode TE2 by the second patterning process 92, a part of the variable resistance material 24 may be patterned to be the first variable resistance layer VR1 by the second patterning process 92, and another part of variable resistance material 24 may be patterned to be the second variable resistance layer VR2 by the second patterning process 92. The first bottom electrode TE1, the first variable resistance layer VR1, and the first top electrode TE1 may constitute the first resistive switching element RS1. The second bottom electrode TE2, the second variable resistance layer VR2, and the second top electrode TE2 may constitute the second resistive switching element RS2. The second top electrode TE2 may be directly connected with the first top electrode TE1, and the second variable resistance layer VR2 may be directly connected with the first variable resistance layer VR1. In some embodiments, the second patterning process 92 may include forming a patterned photoresist layer 34 on the second electrically conductive layer 26 and performing an etching process using the patterned photoresist layer 34 as an etching mask to the second electrically conductive layer 26 and the variable resistance material 24 for generating the patterning effect, and the patterned photoresist layer 34 may be removed after the second patterning process 92, but not limited thereto. Additionally, in some embodiments, the variable resistance layer 24 formed in the trench TR2 and the second electrically conductive layer 26 formed in the trench TR2 may be removed by the second patterning process 92, and there is not any second electrically conductive layer 26, not any variable resistance material 24, and not any first electrically conductive layer 22 remaining in the trench TR2 after the second patterning process 92. It is worth noting that the method of forming the resistive switching element RS in this embodiment may include but is not limited to the steps illustrated in FIGS. 3-12 described above, and the resistive switching element RS may be formed by other suitable approaches according to some design considerations.

As shown in FIG. 11, FIG. 12, FIG. 15, and FIG. 16, after the second patterning process 92, the signal line structure SL may be formed in the trench TR1, and a conductive line M2 may be formed in the trench TR2. In some embodiments, the signal line structure SL and the conductive line M2 may be formed concurrently by the same process, and a material composition of the conductive line M2 may be identical to a material composition of the signal line structure SL accordingly, but not limited thereto. In addition, as shown in FIGS. 15-17, a part of the signal line structure SL may be formed on the first resistive switching element RS1, another part of the signal line structure SL may be formed on the second resistive switching element RS2, and the signal line structure SL may be electrically connected with the first top electrode TE1 and the second top electrode TE2. In some embodiments, a depth of the trench TR1 may be substantially equal to a depth of the trench TR2, and a thickness TK2 of the conductive line M2 in the vertical direction D3 may be greater than a thickness TK1 of the signal line structure SL formed on the resistive switching element RS (such as the first resistive switching element RS1) in the vertical direction D3 because the material layers located in the trench TR2 are removed before the step of forming the conductive line M2.

In some embodiments, the method of forming the conductive line M2 and the signal line structure SL may include but is not limited to the following steps. As shown in FIGS. 11-14, after the second patterning process 92, a barrier layer 42 may be formed on the dielectric layer DL and the resistive switching elements RS, and a metal layer 44 may be formed on the barrier layer 42. The barrier layer 42 may be formed partly in the trench TR1 and the trench TR2 and formed partly outside the trench TR1 and the trench TR2, and the metal layer 44 may be formed partly in the trench TR1 and the trench TR2 and formed partly outside the trench TR1 and the trench TR2, also. Subsequently, as shown in FIG. 15 and FIG. 16, a planarization process 93 may be performed for removing the barrier layer 42 located outside the trench TR1 and the trench TR2 and the metal layer 44 located outside the trench TR1 and the trench TR2 and forming the signal line structure SL and the conductive line M2 in the trench TR1 and the trench TR2, respectively. In addition, the first electrically conductive layer 22 located outside the trench TR1 and the trench TR2 (such as the bottom electrodes BE located outside the trench TR1 and the trench TR2), the variable resistance material 24 located outside the trench TR1 and the trench TR2 (such as the variable resistance layers VR located outside the trench TR1 and the trench TR2), and the second electrically conductive layer 26 located outside the trench TR1 and the trench TR2 (such as the top electrodes TE located outside the trench TR1 and the trench TR2) may be removed by the planarization process 93. Therefore, the signal line structure SL may be regarded as the barrier layer 42 and the metal layer 44 remaining in the trench TR1 after the planarization process 93, and the conductive line M2 may be regarded as the barrier layer 42 and the metal layer 44 remaining in the trench TR2 after the planarization process 93. In some embodiments, the planarization process 93 may include a chemical mechanical polishing (CMP) process or other suitable planarization approaches, and the top surface 14TS of the dielectric layer DL, the top surface 22TS of the bottom electrode BE, the top surface 24TS of the variable resistance layer VR, the top surface 26TS of the top electrode TE, the top surface 42TS of the barrier layer 42, and the top surface 44TS of the metal layer 44 may be substantially coplanar after the planarization process 93, but not limited thereto. As shown in FIG. 16 and FIG. 18, after the planarization process 93, the dielectric layer 46, the via structure V2, and the conductive line M3 described above may be formed for forming the resistive memory device 100 illustrated in FIG. 1. In some embodiments, the conductive line M1, the via structure V1, and the conductive line M2 in FIG. 15 described above may be regarded as a portion of an interconnection structure formed in the back end of line (BEOL) process in the semiconductor manufacturing process, and the via structure V1 and the conductive line M3 in FIG. 18 and FIG. 1 may be regarded as another portion of the interconnection structure. Therefore, the manufacturing method of the resistive memory device 100 may be integrated with the manufacturing method of the interconnection structure for simplifying the overall manufacturing processes, but not limited thereto.

To summarize the above descriptions, in the resistive memory device and the manufacturing method thereof according to the present invention, the resistive switching element with the three-dimensional configuration may be formed by forming the resistive switching element and the corresponding signal line structure in the trench, and the operation characteristics of the resistive switching elements may be enhanced and/or the disposition density of the resistive switching elements may be increased accordingly. In addition, the manufacturing method of the resistive switching element and the signal line structure may be integrated with the manufacturing process of other conductive lines and/or interconnection structures for simplifying the overall manufacturing processes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistive memory device, comprising:
a dielectric layer;
a trench disposed in the dielectric layer, wherein the trench is elongated in a first horizontal direction;
a first resistive switching element disposed in the trench, wherein the first resistive switching element comprises:
a first bottom electrode;
a first top electrode disposed above the first bottom electrode; and
a first variable resistance layer disposed between the first bottom electrode and the first top electrode;
a diode via structure disposed in the dielectric layer and located under the trench, wherein the diode via structure is connected with the first bottom electrode; and
a signal line structure disposed in the trench, wherein a part of the signal line structure is disposed on the first resistive switching element, and the signal line structure is electrically connected with the first top electrode,
wherein in a cross-sectional view of the resistive memory device, the first variable resistance layer comprises a U-shaped structure surrounding the signal line structure and the first top electrode in a second horizontal direction.

2. The resistive memory device according to claim 1, wherein in the cross-sectional view of the resistive memory device, the first top electrode comprises a U-shaped structure surrounding the signal line structure in the second horizontal direction.

3. The resistive memory device according to claim 1, wherein in the cross-sectional view of the resistive memory device, the first bottom electrode comprises a U-shaped structure surrounding the signal line structure, the first top electrode, and the first variable resistance layer in the second horizontal direction.

4. The resistive memory device according to claim 1, wherein a part of the first resistive switching element is sandwiched between the signal line structure and the dielectric layer in the second horizontal direction.

5. The resistive memory device according to claim 1, wherein a top surface of the first top electrode, a top surface of the first variable resistance layer, and a top surface of the first bottom electrode are coplanar.

6. The resistive memory device according to claim 1, wherein a top surface of the dielectric layer and a top surface of the first bottom electrode are coplanar.

7. The resistive memory device according to claim 1, wherein a top surface of the signal line structure and a top surface of the first top electrode are coplanar.

8. The resistive memory device according to claim 1, further comprising:

a second resistive switching element disposed in the trench, wherein the second resistive switching element comprises:

a second bottom electrode;

a second top electrode disposed above the second bottom electrode; and a second variable resistance layer disposed between the second bottom electrode and the and the second top electrode, wherein another part of the signal line structure is disposed on the second resistive switching element, and the signal line structure is electrically connected with the second top electrode.

9. The resistive memory device according to claim 1, further comprising:

a bit line structure disposed in the dielectric layer and located under the diode via structure, wherein the bit line structure is connected with the diode via structure.

\*　\*　\*　\*　\*